United States Patent
Gan

(10) Patent No.: US 9,508,717 B2
(45) Date of Patent: Nov. 29, 2016

(54) INTEGRATED CIRCUIT DEVICE AND REPAIR METHOD THEREOF

(71) Applicant: Semiconductor Manufacturing International (Shanghai) Corporation, Shanghai (CN)

(72) Inventor: Zhenghao Gan, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 14/797,126

(22) Filed: Jul. 11, 2015

(65) Prior Publication Data

US 2016/0028376 A1 Jan. 28, 2016

(30) Foreign Application Priority Data

Jul. 28, 2014 (CN) .......................... 2014 1 0363404

(51) Int. Cl.
*H03K 19/003* (2006.01)
*H01L 27/092* (2006.01)

(52) U.S. Cl.
CPC ....... *H01L 27/092* (2013.01); *H03K 19/00315* (2013.01); *H03K 19/00384* (2013.01)

(58) Field of Classification Search
None
See application file for complete search history.

(56) References Cited

U.S. PATENT DOCUMENTS

| | | | | |
|---|---|---|---|---|
| 5,898,235 A * | 4/1999 | McClure | ............... | G11C 5/147 307/64 |
| 6,351,176 B1 * | 2/2002 | Houston | ............... | G11C 7/062 327/534 |
| 6,404,243 B1 * | 6/2002 | Koch, II | ............... | H03K 5/133 327/107 |
| 6,466,077 B1 * | 10/2002 | Miyazaki | ............... | G05F 3/205 326/33 |
| 7,897,956 B2 * | 3/2011 | Siprak | .................. | H01L 21/761 257/2 |
| 8,098,536 B2 * | 1/2012 | Hsu | ........................ | G11C 29/04 365/200 |
| 2006/0132187 A1 * | 6/2006 | Tschanz | ............ | H03K 19/0963 326/95 |
| 2006/0132218 A1 * | 6/2006 | Tschanz | ................. | G05F 3/205 327/534 |
| 2010/0102872 A1 * | 4/2010 | Wu | ........................ | G05F 3/205 327/534 |
| 2014/0312961 A1 * | 10/2014 | Seo | ........................ | G11C 7/04 327/513 |

* cited by examiner

*Primary Examiner* — Thomas J Hiltunen
(74) *Attorney, Agent, or Firm* — Anova Law Group, PLLC

(57) ABSTRACT

The present disclosure provides integrated circuit (IC) devices and repair methods of the IC devices. An IC device includes a PMOS transistor including a substrate, a gate dielectric layer on the substrate, and a gate on the gate dielectric layer. The IC device also includes a repair circuit configured to apply a negative bias voltage to the substrate of the PMOS transistor, when the PMOS transistor is in an OFF state, to cause injections of electrons in the substrate into the gate dielectric layer to neutralize holes caused by negative bias temperature instability (NBTI) effect. The repair circuit is further configured to stop applying the negative bias voltage to the substrate of the PMOS transistor when the PMOS transistor is in an ON state. As such, the disclosed IC device repairs defect caused by NBTI effect in the PMOS transistor and prolongs the lifespan of the PMOS transistor.

16 Claims, 4 Drawing Sheets

INTEGRATED CIRCUIT DEVICE AND REPAIR METHOD THEREOF

CROSS-REFERENCES TO RELATED APPLICATIONS

This application claims the priority of Chinese patent application No. 201410363404.7, filed on Jul. 28, 2014, the entirety of which is incorporated herein by reference.

FIELD OF THE DISCLOSURE

The present disclosure generally relates to the field of semiconductor fabrication techniques and, more particularly, relates to integrated circuit (IC) devices and repair methods of the IC devices.

BACKGROUND

As high degree of integration becomes more and more demanding for integrated circuit (IC) devices, the reliability requirement of transistors is also increased. In CMOS process, negative bias temperature instability (NBTI) is a key factor when evaluating the reliability of PMOS transistors. NBTI occurs, when a PMOS transistor is under negative gate bias voltages and high temperatures. In this case, silicon-hydrogen bond at the interface between the gate oxide and the substrate of the PMOS transistor breaks and thereby forms interface defect charges, which may cause threshold voltage drift and saturation current drift of the PMOS transistor to occur.

FIG. 1 is a schematic diagram illustrating a circuit to test NBTI effect in a PMOS transistor. When testing NBTI effect in PMOS transistor (P10), at a high ambient temperature (typically 125° C.), a negative stress voltage Vstress is applied to the gate of PMOS transistor P10, and a 0V voltage is applied to the source, the drain and the substrate of PMOS transistor P10, i.e., to ground the source, the drain and the substrate of PMOS transistor P10. Testing the NBTI effect in PMOS transistor P10 reduces the absolute values of linear region drain current (Idlin), saturation drain current (Idsat), and low frequency trans-conductance (gm). In the meantime, testing the NBTI effect in PMOS transistor P10 increases the absolute values of drain-source cutoff current (Ioff), threshold voltage (Vt), and gate-induced drain leakage (GIDL) current.

Specifically, FIG. 2 is a diagram illustrating how drain current changes with gate-source voltage in the PMOS transistor P10 shown in FIG. 1. The horizontal axis represents gate-source voltage (Volt) in the PMOS transistor P10 and the vertical axis represents drain current (Ampere) in the PMOS transistor P10. The solid curve L21 in FIG. 2 shows the relationship between drain current and gate-source voltage in PMOS transistor P10 before NBTI test, while the dotted curve L22 shows the relationship between drain current and gate-source voltage in the PMOS transistor P10 after NBTI test. As shown, the NBTI test reduces drain current in PMOS transistor P10.

FIG. 3 is a diagram illustrating how low frequency trans-conductance changes with gate-source voltage in PMOS transistor P10 shown in FIG. 1. The horizontal axis represents gate-source voltage (Volt) in PMOS transistor P10 and the vertical axis represents low frequency trans-conductance (Siemens) in PMOS transistor P10. The solid curve L31 shows the relationship between low frequency trans-conductance and gate-source voltage in PMOS transistor P10 before NBTI test, while the dotted curve L32 shows the relationship between low frequency trans-conductance and gate-source voltage in PMOS transistor P10 after NBTI test. As shown, NBTI test reduces the maximum value of low frequency trans-conductance in PMOS transistor P10.

As the critical dimension (CD) of semiconductor devices shrinks, the NBTI effect in PMOS transistors has become increasingly evident and adversely affects the lifespan of PMOS transistors. Therefore, it is desirable to mitigate the NBTI effect in PMOS transistor.

SUMMARY

One aspect or embodiment of the present disclosure provides an IC device. The IC device includes a PMOS transistor including a substrate, a gate dielectric layer on the substrate, and a gate on the gate dielectric layer. The IC device also includes a repair circuit configured to apply a negative bias voltage to the substrate of the PMOS transistor, when the PMOS transistor is in an OFF state, to cause injections of electrons in the substrate into the gate dielectric layer to neutralize holes caused by negative bias temperature instability (NBTI) effect. The repair circuit is further configured to stop applying the negative bias voltage to the substrate of the PMOS transistor when the PMOS transistor is in an ON state.

Another aspect or embodiment of the present disclosure provides a method for repairing a PMOS in an IC device. The IC device is provided to include a PMOS transistor and a repair circuit configured on a same chip. The PMOS transistor includes a substrate, a gate dielectric layer on the substrate, and a gate on the gate dielectric layer. The PMOS transistor is set in an OFF state. A negative bias voltage is applied to the substrate of the PMOS transistor in the OFF state to cause injections of electrons in the substrate into the gate dielectric layer to neutralize holes caused by negative bias temperature instability (NBTI) effect.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

To open a channel region of a PMOS transistor, negative bias voltage must be applied to the gate of the PMOS transistor. The negative bias voltage often causes the NBTI effect in PMOS transistor and shortens the lifespan of PMOS transistor. The present disclosure provides repair circuits and methods for using the repair circuits to repair the PMOS transistor. For example, to mitigate NBTI effect in PMOS transistor, negative bias voltage can be applied to a substrate of the PMOS transistor when the PMOS transistor is in an OFF state.

Figure 1:
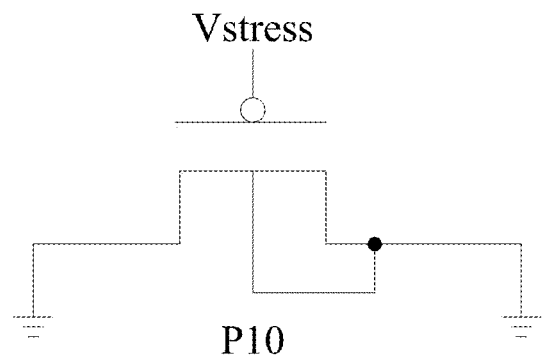
FIG. 1 is a schematic diagram illustrating a circuit to test NBTI effect in a PMOS transistor.
Figure 2:
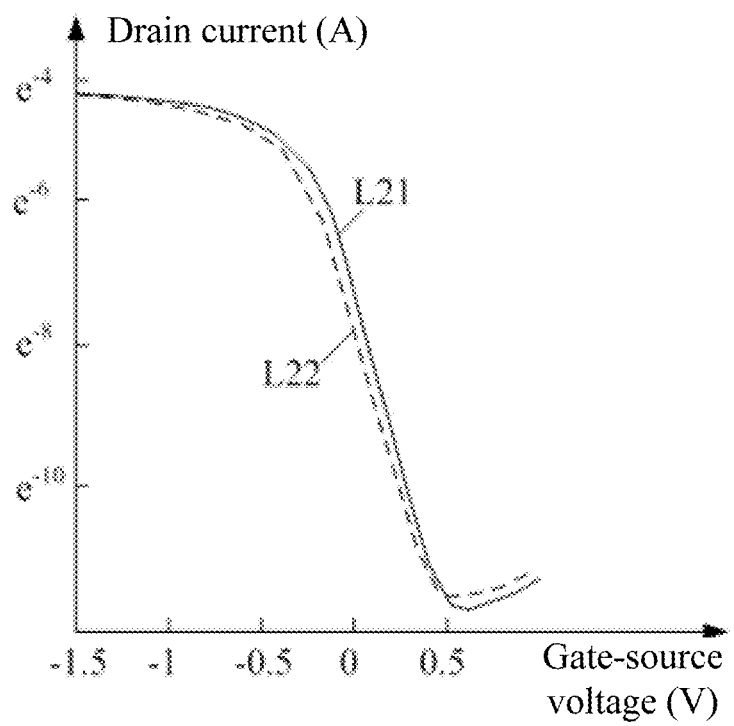
FIG. 2 is a diagram illustrating how drain current changes with gate-source voltage in PMOS transistor P10 shown in FIG. 1.
Figure 3:
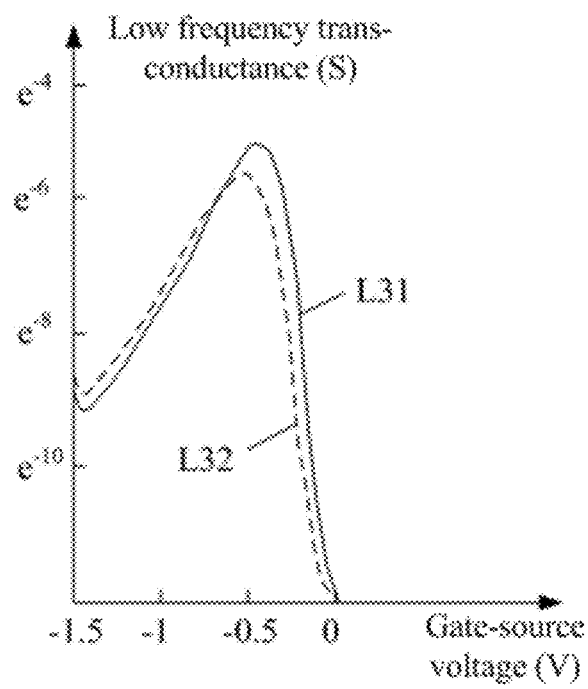
FIG. 3 is a diagram illustrating how low frequency trans-conductance changes with gate-source voltage in PMOS transistor P10 shown in FIG. 1.
Figure 4:
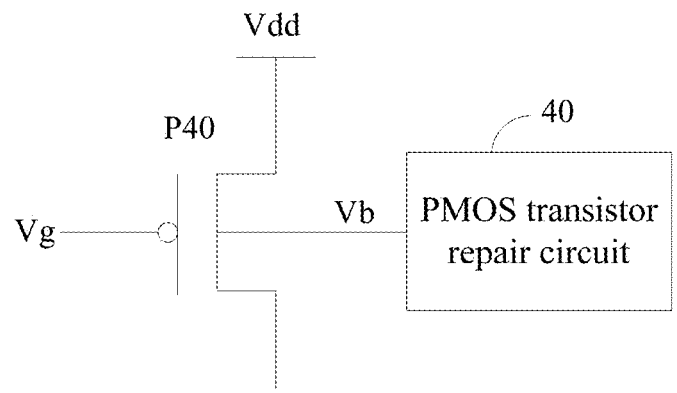
FIG. 4 is a schematic diagram illustrating an exemplary IC device including a PMOS transistor and repair circuit according to various disclosed embodiments of the present disclosure.

FIG. 4 is a schematic diagram illustrating an exemplary IC device including a PMOS transistor and repair circuit according to various disclosed embodiments of the present disclosure. A PMOS transistor P40 is the transistor to be repaired. The PMOS transistor P40 can be a test transistor for reliability testing or any application transistor in a functional chip. The PMOS transistor P40 can have a gate configured to receive a drive signal Vg, a source configured to receive a power supply voltage Vdd of the chip, and a drain configured to as an output signal of the PMOS transistor P40.

Figure 5:
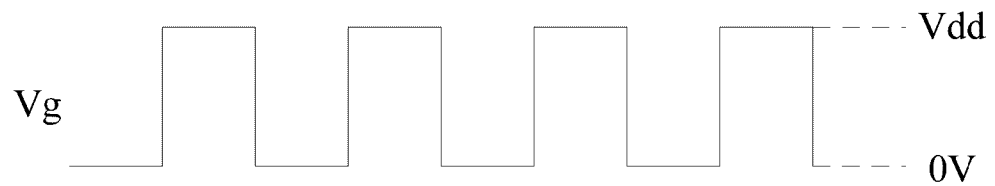
FIG. 5 is a diagram illustrating a waveform of a drive signal used in FIG. 4 according to various disclosed embodiments of the present disclosure.

FIG. 5 is a diagram illustrating a waveform of a drive signal used in FIG. 4 according to various disclosed embodiments of the present disclosure. The high amplitude level of the drive signal Vg is equal to the power supply voltage Vdd and the low amplitude level of the drive signal Vg is equal to 0V. When the drive signal Vg is at the low amplitude level, the negative bias voltage between the gate and the source of the PMOS transistor P40 causes the channel region to open and turns on the PMOS transistor P40 in an operational state. When the drive signal Vg is at the high amplitude level, the zero voltage between the gate and the source of the PMOS transistor P40 turns off the PMOS transistor P40 in the non-operational state.

Referring back to FIG. 4, the repair circuit 40 of the PMOS transistor P40 is configured to apply a negative bias voltage Vb to the substrate of the PMOS transistor P40 when it is in the OFF state. The value of the bias voltage Vb may be set according to the specific fabrication process requirements of the PMOS transistor P40, as long as, when the PMOS transistor P40 is in OFF state, the bias voltage Vb causes the injection of the electrons in the substrate into the gate oxide dielectric layer. The bias voltage Vb is not limited in the present disclosure.

When the PMOS transistor P40 is in the ON state, the negative gate bias voltage thermally excites the holes in the inversion layer of the PMOS transistor P40 and makes them tunnel into the gate oxide dielectric layer, which causes the NBTI effect. As disclosed, the repair circuit 40 of the PMOS transistor P40 applies the bias voltage Vb to the substrate of the PMOS transistor P40 when it is in the OFF state. The negative bias voltage Vb injects the electrons in the substrate into the gate oxide dielectric layer, neutralizes the holes caused by the NBTI effect, repairs the defects of the PMOS transistor caused by the NBTI effect, and prolongs the lifespan of the PMOS transistor P40.

Further, when the PMOS transistor P40 is in the ON state, the repair circuit 40 is configured to stop applying the bias voltage Vb to the substrate of the PMOS transistor P40. In other words, when the PMOS transistor P40 is in the operational state, the substrate of the PMOS transistor P40 is in a floating state.

Figure 6:
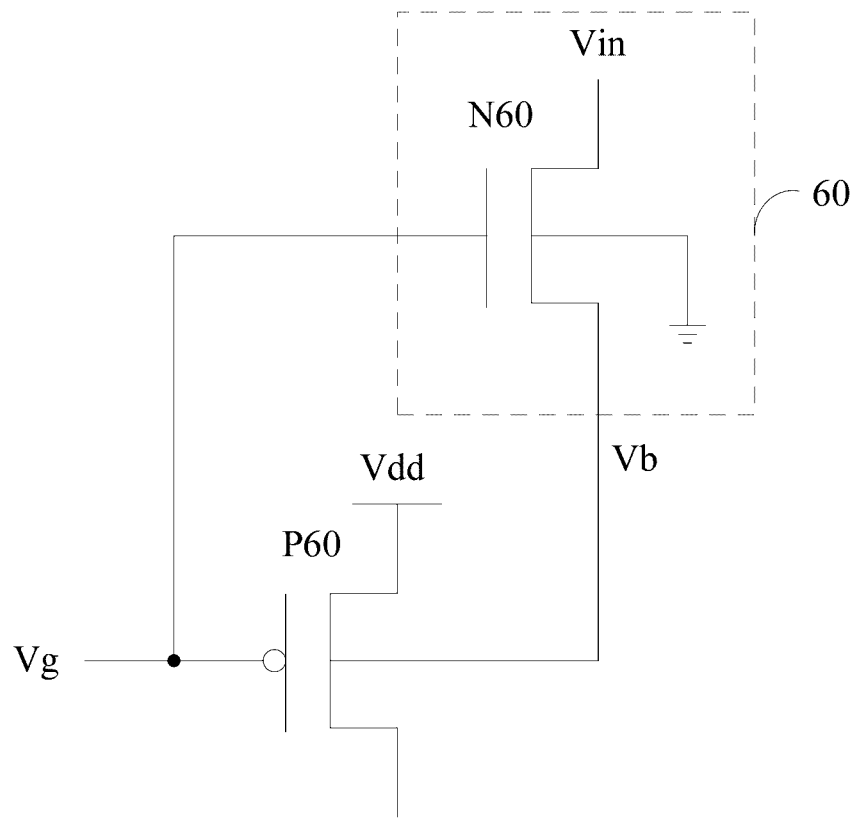
FIG. 6 is a schematic diagram illustrating another exemplary IC device including a PMOS transistor and repair circuit according to various disclosed embodiments of the present disclosure.

FIG. 6 is a schematic diagram illustrating another exemplary IC device including a PMOS transistor and repair circuit according to various disclosed embodiments of the present disclosure. In the PMOS transistor P60 to be repaired, the gate of the PMOS transistor P60 is configured to receive the drive signal Vg, the source of the PMOS transistor P60 is configured to receive the power supply voltage Vdd, and the drain of the PMOS transistor P60 is configured as an output end of the PMOS transistor P60. The drive signal Vg may be similar to or the same as the drive signal Vg as discussed in FIG. 5.

In one embodiment, the repair circuit 60 of the PMOS transistor P60 includes an NMOS transistor N60. The gate of the NMOS transistor N60 connects to the gate of the PMOS transistor P60, i.e., the gate of the NMOS transistor N60 is also configured to receive the drive signal Vg. The drain of the NMOS transistor N60 is configured to receive an input voltage Vin. The source of the NMOS transistor N60 connects to the substrate of the PMOS transistor P60. The substrate of the NMOS transistor N60 is grounded. The input voltage Vin has a negative value, which may be set according to specific fabrication process requirements of the PMOS transistor P60. The input voltage Vin is not limited in the present disclosure. In one embodiment, the absolute value of the input voltage Vin can be greater than the absolute value of the power supply voltage Vdd.

When the drive signal Vg is at the low level, the PMOS transistor P60 is turned on, the NMOS transistor N60 is turned off, and the repair circuit 60 of the PMOS transistor P60 stops outputting the bias voltage Vb. When the drive signal Vg is at the high level, the PMOS transistor P60 is turned off, the NMOS transistor N60 is turned on, and the repair circuit 60 of the PMOS transistor P60 may output the bias voltage Vb to the gate of the PMOS transistor P60 to repair defects of the PMOS transistor P60. Further, because the NMOS transistor N60 and the PMOS transistor P60 share the drive signal Vg, there is no need for additional drive circuit. This simplifies the structure of the repair circuit 60 of the PMOS transistor circuit P60.

Figure 7:
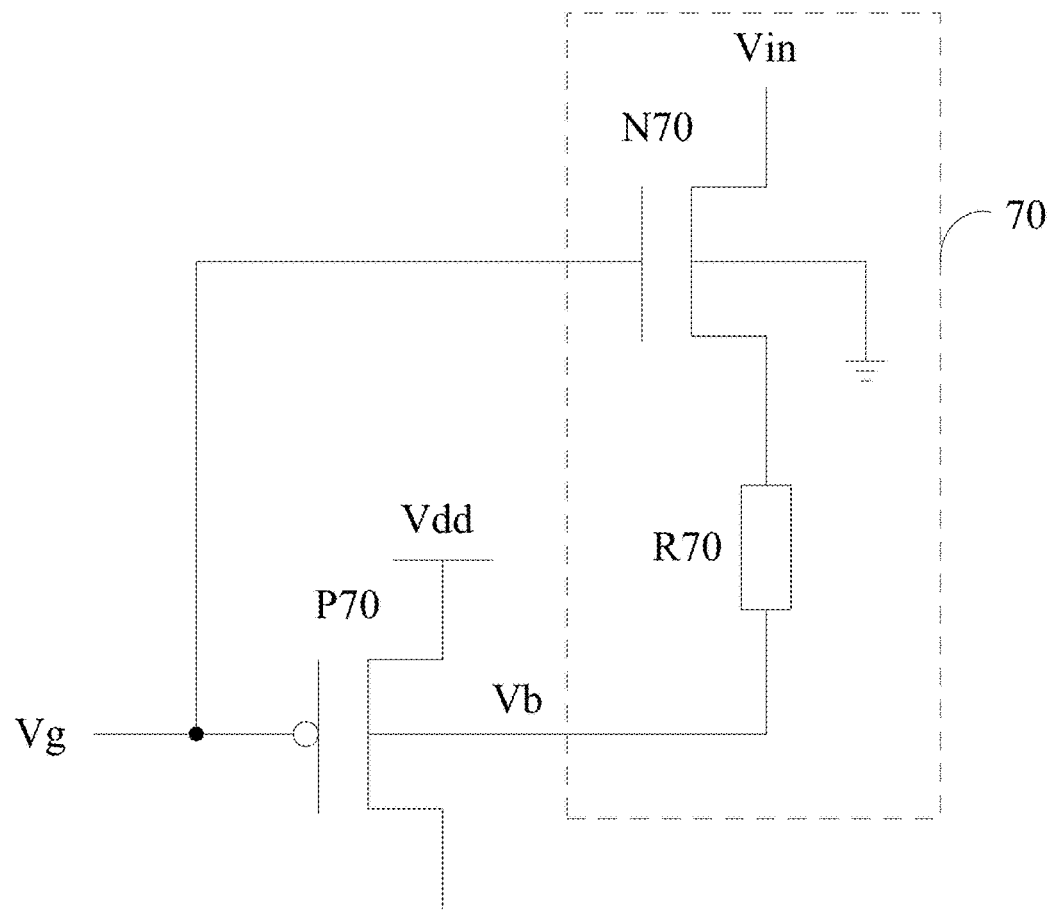
FIG. 7 is a schematic diagram illustrating another exemplary IC device including a PMOS transistor and repair circuit according to various disclosed embodiments of the present disclosure.

FIG. 7 is a schematic diagram illustrating another exemplary IC device including a PMOS transistor and repair circuit according to various disclosed embodiments of the present disclosure. The repair circuit 70 is configured to repair the PMOS transistor P70. The repair circuit 70 of the PMOS transistor P70 includes an NMOS transistor N70 and a resistor R70. In this example, the structure of the NMOS transistor N70 and the PMOS transistor P70 is similar to the structure shown in FIG. 6, except that the source of the NMOS transistor N70 connects to the substrate of the PMOS transistor P70 through the resistor R70. The resistor R70 may be an adjustable resistor or variable resistor. By adjusting the resistance of the resistor 70, the bias voltage value of Vb can be adjusted to accommodate fabrication process variation of the PMOS transistor P70.

The repair circuit can be an on-chip circuit configured with the PMOS transistor on a same chip. In some embodiments, the repair circuit can include the NMOS transistor and can be an on-chip circuit configured with the PMOS transistor on a same chip. In other embodiments, the repair circuit can include the NMOS transistor and the resistor, and can be an on-chip circuit configured with the PMOS transistor on a same chip.

The present disclosure also provides methods for repairing a PMOS transistor in an IC device containing the PMOS transistor and the repair circuit. In an exemplary method, the PMOS transistor is controlled to be in an OFF state. When the PMOS transistor is in the OFF state, a negative bias voltage can be applied to a substrate of the PMOS transistor. The negative bias voltage can have a negative value. The PMOS transistor can be controlled to be in an ON state. When the PMOS transistor is in the ON state, the bias voltage is removed from the substrate of the PMOS transistor.

In some cases, to control or set the PMOS transistor in the OFF state, a chip power supply voltage can be applied to the source of the PMOS transistor, and a high level voltage signal can be applied to the gate of the PMOS transistor. To control or set the PMOS transistor in the ON state, the chip power supply voltage can be applied to the source of the PMOS transistor, and a low level voltage signal can be applied to the gate of the PMOS transistor. The high level voltage signal amplitude is equal to the power supply voltage. The low level signal amplitude is 0V.

For example, the IC device can further include an NMOS transistor. The NMOS transistor has a gate connecting to the gate of the PMOS transistor, has a drain configured to receive an input voltage, and has a source connecting to the substrate of the PMOS transistor. The substrate of the NMOS transistor can be grounded. A zero voltage value can be applied as the input voltage to the drain of the NMOS transistor. A drive signal can be applied to the gate of the PMOS transistor. A chip power supply voltage can be applied to the source of the PMOS transistor such that an absolute value of the input voltage applied to the drain of the NMOS transistor is greater than a voltage value of the chip power supply voltage applied to the source of the PMOS transistor.

In other embodiments, the IC device can further include a resistor to connect the source of the NMOS transistor with the substrate of the PMOS transistor through the resistor. The resistor can be an adjustable resistor.

As such, the present disclosure solves the problem that the NBTI effect shortens the lifespan of PMOS transistors. Compared to conventional devices, the disclosed IC devices have the following advantages. For example, negative bias voltage can be applied, by the repair circuit, to the substrate of the PMOS transistor, when the PMOS transistor is in an OFF state. Electrons can be injected into the gate oxide dielectric layer of the PMOS transistor to neutralize holes generated due to NBTI effect in the gate oxide dielectric layer to thus mitigate the NBTI effect, and to finally prolong the lifespan of the PMOS transistors.

When the repair circuit of the IC devices includes an NMOS transistor, the gate of the NMOS transistor connects to the gate of the PMOS transistor. In other words, because the NMOS transistor and the PMOS transistor share the common drive signal, there is no need for additional drive circuit. This simplifies the structure of the repair circuit of the PMOS transistor. When the repair circuit of the IC devices further includes a resistor, the source of the NMOS transistor connects to the substrate of the PMOS transistor through the resistor. The resistor may be an adjustable resistor. By adjusting the resistance, the bias voltage value can be changed to accommodate fabrication process variations.

Other applications, advantages, alternations, modifications, or equivalents to the disclosed embodiments are obvious to those skilled in the art.

What is claimed is:

1. An integrated circuit (IC) device, comprising:
a PMOS transistor, including a substrate, a gate dielectric layer on the substrate, and a gate on the gate dielectric layer; and
a repair circuit, including an NMOS transistor and configured to apply a negative bias voltage to the substrate of the PMOS transistor, when the PMOS transistor is in an OFF state, to cause injections of electrons in the substrate into the gate dielectric layer to neutralize holes caused by negative bias temperature instability (NBTI) effect,
wherein:
the repair circuit is further configured to stop applying the negative bias voltage to the substrate of the PMOS transistor when the PMOS transistor is in an ON state, and
the NMOS transistor has a gate connecting to the gate of the PMOS transistor, has a source connecting to the substrate of the PMOS transistor, and has a drain configured to receive an input voltage having a negative value as a highest voltage level provided to the substrate of the PMOS transistor.

2. The IC device according to claim 1, wherein:
the gate of the PMOS transistor is configured to receive a drive signal, and
the source of the PMOS transistor is configured to receive a power supply voltage of the IC device in a chip.

3. The IC device according to claim 2, wherein:
an absolute value of the input voltage to the drain of the NMOS transistor is greater than a voltage value of the power supply voltage to the source of the PMOS transistor.

4. The IC device according to claim 1, wherein the repair circuit further includes a resistor, and the source of the NMOS transistor connects to the substrate of the PMOS transistor through the resistor.

5. The IC device according to claim 4, wherein the resistor is an adjustable resistor.

6. The IC device according to claim 1, wherein the repair circuit is an on-chip circuit configured with the PMOS transistor on a same chip.

7. The IC device according to claim 1, wherein the repair circuit including the NMOS transistor is an on-chip circuit configured with the PMOS transistor on a same chip.

8. The IC device according to claim 4, wherein the repair circuit including the NMOS transistor and the resistor is an on-chip circuit configured with the PMOS transistor on a same chip.

9. A method for repairing a PMOS in an IC device, comprising:
providing the IC device including at least a PMOS transistor, and a repair circuit including an NMOS transistor and configured on a same chip, the PMOS transistor including a substrate, a gate dielectric layer on the substrate, and a gate on the gate dielectric layer, and the NMOS transistor having a gate connecting to the gate of the PMOS transistor, having a source connecting to the substrate of the PMOS transistor, and having a drain configured to receive an input voltage having a negative value as a highest voltage level provided to the substrate of the PMOS transistor;
setting the PMOS transistor in an OFF state; and applying a negative bias voltage to the substrate of the PMOS transistor in the OFF state to cause injections of electrons in the substrate into the gate dielectric layer to neutralize holes caused by negative bias temperature instability (NBTI) effect.

10. The method according to claim 9, further including:
setting the PMOS transistor in an ON state; and
stopping applying the negative bias voltage to the substrate of the PMOS transistor in the ON state.

11. The method according to claim 9, wherein the step of setting the PMOS transistor in the OFF state includes:
applying a chip power supply voltage to the source of the PMOS transistor, and
applying a high level voltage signal to the gate of the PMOS transistor.

12. The method according to claim 10, wherein the step of setting the PMOS transistor in the ON state includes:
applying a chip power supply voltage to the source of the PMOS transistor, and
applying a low level voltage signal to the gate of the PMOS transistor.

13. The method according to claim 9, further including:
applying a drive signal to the gate of the PMOS transistor, and
applying a chip power supply voltage to the source of the PMOS transistor, wherein an absolute value of the input voltage applied to the drain of the NMOS transistor is greater than a voltage value of the chip power supply voltage applied to the source of the PMOS transistor.

14. The method according to claim 9, wherein the repair circuit further includes a resistor to connect the source of the NMOS transistor with the substrate of the PMOS transistor through the resistor, and wherein the resistor is an adjustable resistor.

15. The method according to claim 9, wherein the repair circuit including the NMOS transistor is an on-chip circuit configured with the PMOS transistor on the same chip.

16. The method according to claim 14, wherein the repair circuit including the NMOS transistor and the resistor is an on-chip circuit configured with the PMOS transistor on the same chip.

* * * * *